United States Patent
Kirsch et al.

(10) Patent No.: US 12,543,509 B2
(45) Date of Patent: Feb. 3, 2026

(54) FABRICATION OF ELECTROPLATED NICKEL-IRON LAYERS WITH TITANIUM-COPPER SEED LAYER

(71) Applicant: Infineon Technologies AG, Neubiberg (DE)

(72) Inventors: Michael Kirsch, Regensburg (DE); Patrick Hanekamp, Laaber (DE); Werner Robl, Regensburg (DE); Klemens Prügl, Regensburg (DE); Juergen Zimmer, Neubiberg (DE); Christoph Oswald, Riemerling (DE)

(73) Assignee: Infineon Technologies AG, Neubiberg (DE)

( * ) Notice: Subject to any disclaimer, the term of this patent is extended or adjusted under 35 U.S.C. 154(b) by 369 days.

(21) Appl. No.: 18/448,657

(22) Filed: Aug. 11, 2023

(65) Prior Publication Data
US 2025/0057051 A1    Feb. 13, 2025

(51) Int. Cl.
*H10N 50/85*     (2023.01)
*C23C 14/16*     (2006.01)
(Continued)

(52) U.S. Cl.
CPC ........... *H10N 50/85* (2023.02); *C23C 14/165* (2013.01); *C23C 14/3464* (2013.01);
(Continued)

(58) Field of Classification Search
CPC ....... C23C 14/16; C23C 14/165; C23C 14/34; C23C 14/3464; C23C 14/56; C23C 28/02;
(Continued)

(56) References Cited

U.S. PATENT DOCUMENTS 5,432,734 A * 7/1995 Kawano ............... G01R 33/093
                                                        365/158
6,262,463 B1   7/2001 Miu et al.
(Continued)

FOREIGN PATENT DOCUMENTS

CN   102995083 A   3/2013
CN   103043599 A   4/2013
(Continued)

OTHER PUBLICATIONS

Schiavone, G., et al., "Integration of Electrodeposited Ni—Fe in MEMS with Low-Temperature Deposition and Etch Processes," Materials, vol. 10(3):323, pp. 1-19, 2017.

*Primary Examiner* — Brook Kebede
(74) *Attorney, Agent, or Firm* — Harrity & Harrity, LLP

(57) ABSTRACT

A layered structure includes a silicon-based substrate comprising a substrate surface; a titanium-copper seed layer arranged on the substrate surface, wherein the titanium-copper seed layer comprises a titanium layer and a copper layer, wherein the titanium layer is arranged on the substrate surface such that covalent bonds are formed between the titanium layer and silicon of the silicon-based substrate, and wherein the copper layer is arranged directly on the titanium layer, such that the titanium layer is arranged between the substrate surface and the copper layer; and a nickel-iron plating layer arranged directly on the copper layer of the titanium-copper seed layer such that the titanium-copper seed layer is arranged between the silicon-based substrate and the nickel-iron plating layer.

22 Claims, 5 Drawing Sheets

(51) Int. Cl.
*C23C 14/34* (2006.01)
*C23C 28/02* (2006.01)
*C25D 3/56* (2006.01)
*C25D 5/02* (2006.01)
*C25D 7/12* (2006.01)
*G01R 33/02* (2006.01)
*H10N 50/01* (2023.01)
*H10N 59/00* (2023.01)

(52) U.S. Cl.
CPC ............ *C23C 28/021* (2013.01); *C25D 3/562* (2013.01); *C25D 5/022* (2013.01); *C25D 7/123* (2013.01); *G01R 33/02* (2013.01); *H10N 50/01* (2023.02); *H10N 59/00* (2023.02)

(58) Field of Classification Search
CPC ........ C23C 28/021; C25D 3/56; C25D 3/562; C25D 5/02; C25D 5/022; C25D 5/12; C25D 5/54; C25D 7/12; C25D 7/123; G01R 33/00; G01R 33/0052; G01R 33/02; G01R 33/20; H10N 50/00; H10N 50/01; H10N 50/85; H10N 52/00; H10N 59/00; H10B 61/00

See application file for complete search history.

(56) References Cited

U.S. PATENT DOCUMENTS

| 6,741,434 | B1* | 5/2004 | Sato | ...................... B82Y 25/00 |
| | | | | 257/E43.004 |
| 2003/0128483 | A1* | 7/2003 | Kamijo | .................. H10N 50/10 |
| | | | | 365/158 |

FOREIGN PATENT DOCUMENTS

| CN | 103569951 A | 2/2014 |
| EP | 3506347 A1 | 7/2019 |

\* cited by examiner

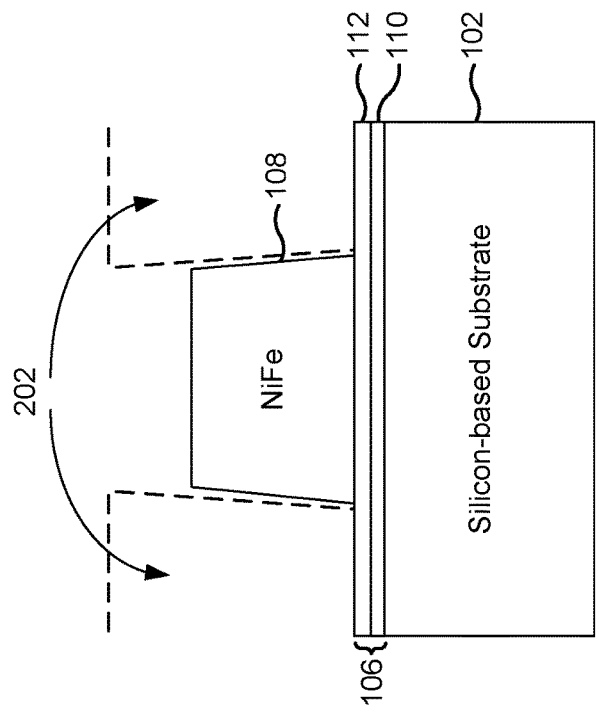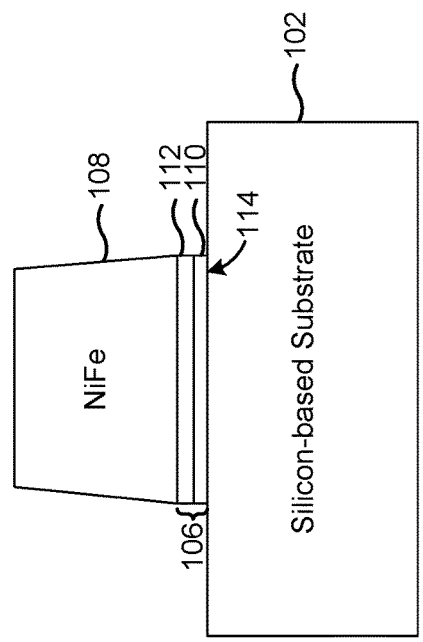

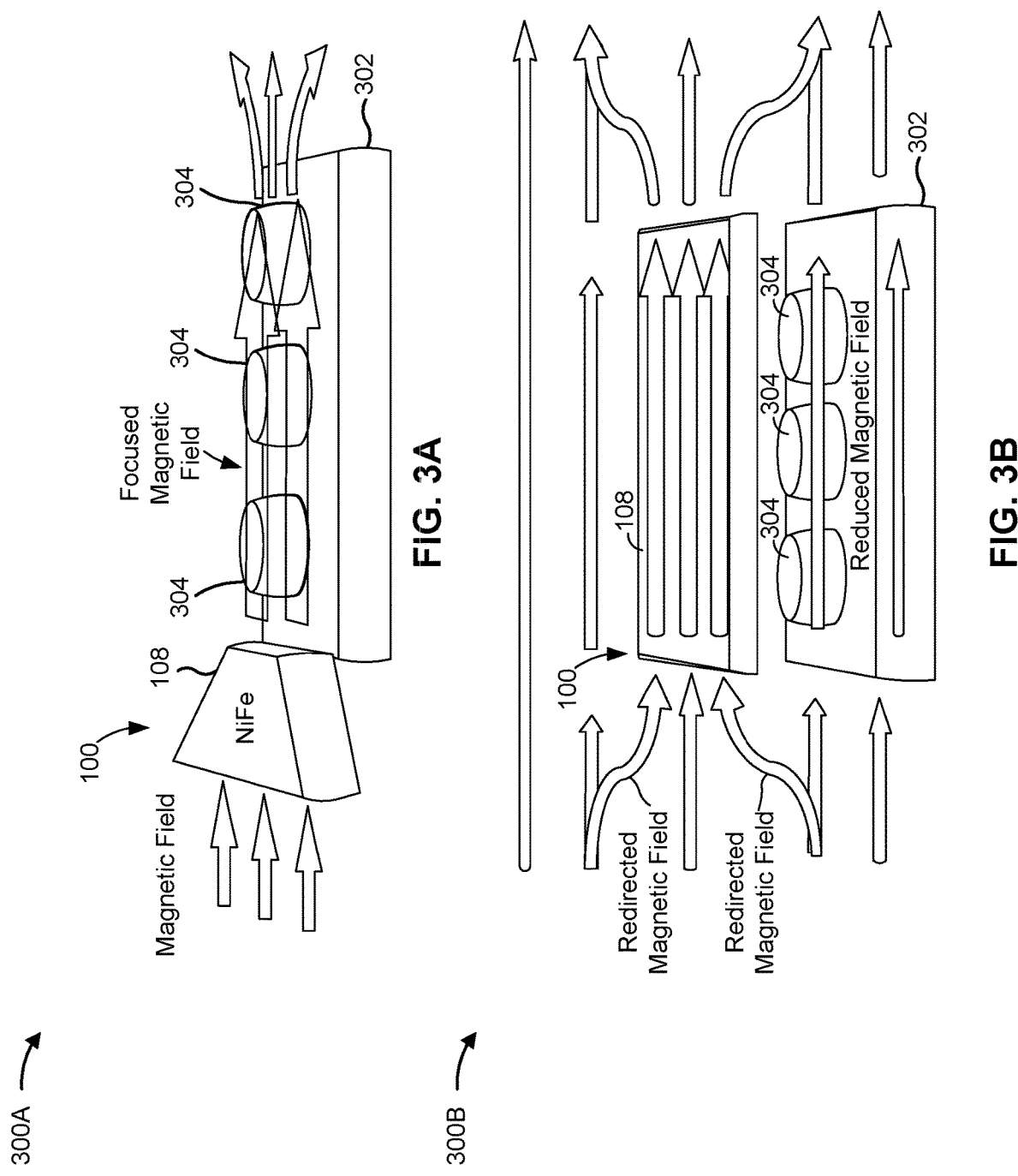

FABRICATION OF ELECTROPLATED NICKEL-IRON LAYERS WITH TITANIUM-COPPER SEED LAYER

BACKGROUND

A seed layer is typically used for pattern plating processes, such as an electro-galvanic deposition (e.g., electroplating) of a metal layer. Seed layers can help to distribute current homogeneously over a wafer to realize uniform growth and correct lattice structure of galvanically-deposited metal layers. A seed layer should provide a good adhesion between the galvanically-deposited metal layer and the wafer, enable homogeneous growth of the galvanically-deposited metal layer over the wafer, and define a lattice structure of the galvanically-deposited metal layer that is stable. In order to enable homogeneous growth of the galvanically-deposited metal layer over the wafer, the seed layer should have suitable conductivity to enable homogeneous distribution of current in the seed layer during an electro-galvanic deposition process.

SUMMARY

In some implementations, a layered structure includes a silicon-based substrate comprising a substrate surface; a titanium-copper seed layer arranged on the substrate surface, wherein the titanium-copper seed layer comprises a titanium layer and a copper layer, wherein the titanium layer is arranged on the substrate surface such that covalent bonds are formed between the titanium layer and silicon of the silicon-based substrate, and wherein the copper layer is arranged directly on the titanium layer, such that the titanium layer is arranged between the substrate surface and the copper layer; and a nickel-iron plating layer arranged directly on the copper layer of the titanium-copper seed layer such that the titanium-copper seed layer is arranged between the silicon-based substrate and the nickel-iron plating layer.

In some implementations, a magnetic sensor system includes a magnetic sensor configured to generate a sensor signal in response to a magnetic field incident at the magnetic sensor; and a layered structure, comprising: a silicon-based substrate comprising a substrate surface; a titanium-copper seed layer arranged on the substrate surface, wherein the titanium-copper seed layer comprises a titanium layer and a copper layer, wherein the titanium layer is arranged on the substrate surface such that covalent bonds are formed between the titanium layer and silicon of the silicon-based substrate, and wherein the copper layer is arranged directly on the titanium layer, such that the titanium layer is arranged between the substrate surface and the copper layer; and a nickel-iron plating layer arranged directly on the copper layer of the titanium-copper seed layer such that the titanium-copper seed layer is arranged between the silicon-based substrate and the nickel-iron plating layer, wherein the nickel-iron plating layer has a plating pattern configured to manipulate the magnetic field incident at the magnetic sensor.

In some implementations, a method of manufacturing an electroplated structure includes providing a silicon-based substrate comprising a substrate surface; forming a titanium layer directly on the substrate surface such that covalent bonds are formed between the titanium layer and silicon of the silicon-based substrate; forming a copper layer directly on the titanium layer such that the titanium layer is arranged between the silicon-based substrate and the copper layer; and forming, by electro-galvanic deposition, a nickel-iron plating layer directly on the copper layer such that the copper layer is arranged between the titanium layer and the nickel-iron plating layer.

In some implementations, a semiconductor device includes a layered structure integrated in the semiconductor device, the layered structure comprising: a silicon-based substrate comprising a substrate surface; a titanium-copper seed layer arranged on the substrate surface, wherein the titanium-copper seed layer comprises a titanium layer and a copper layer, wherein the titanium layer is arranged on the substrate surface such that covalent bonds are formed between the titanium layer and silicon of the silicon-based substrate, and wherein the copper layer is arranged directly on the titanium layer, such that the titanium layer is arranged between the substrate surface and the copper layer; and a nickel-iron plating layer arranged directly on the copper layer of the titanium-copper seed layer such that the titanium-copper seed layer is arranged between the silicon-based substrate and the nickel-iron plating layer.

BRIEF DESCRIPTION OF THE DRAWINGS

Implementations are described herein with reference to the appended drawings.

FIGS. 2A-2D illustrate an example process directed to manufacturing an electroplated structure according to one or more implementations.

FIG. 3A illustrates a magnetic sensor system according to one or more implementations.

FIG. 3B illustrates a magnetic sensor system according to one or more implementations.

DETAILED DESCRIPTION

Figure 1:
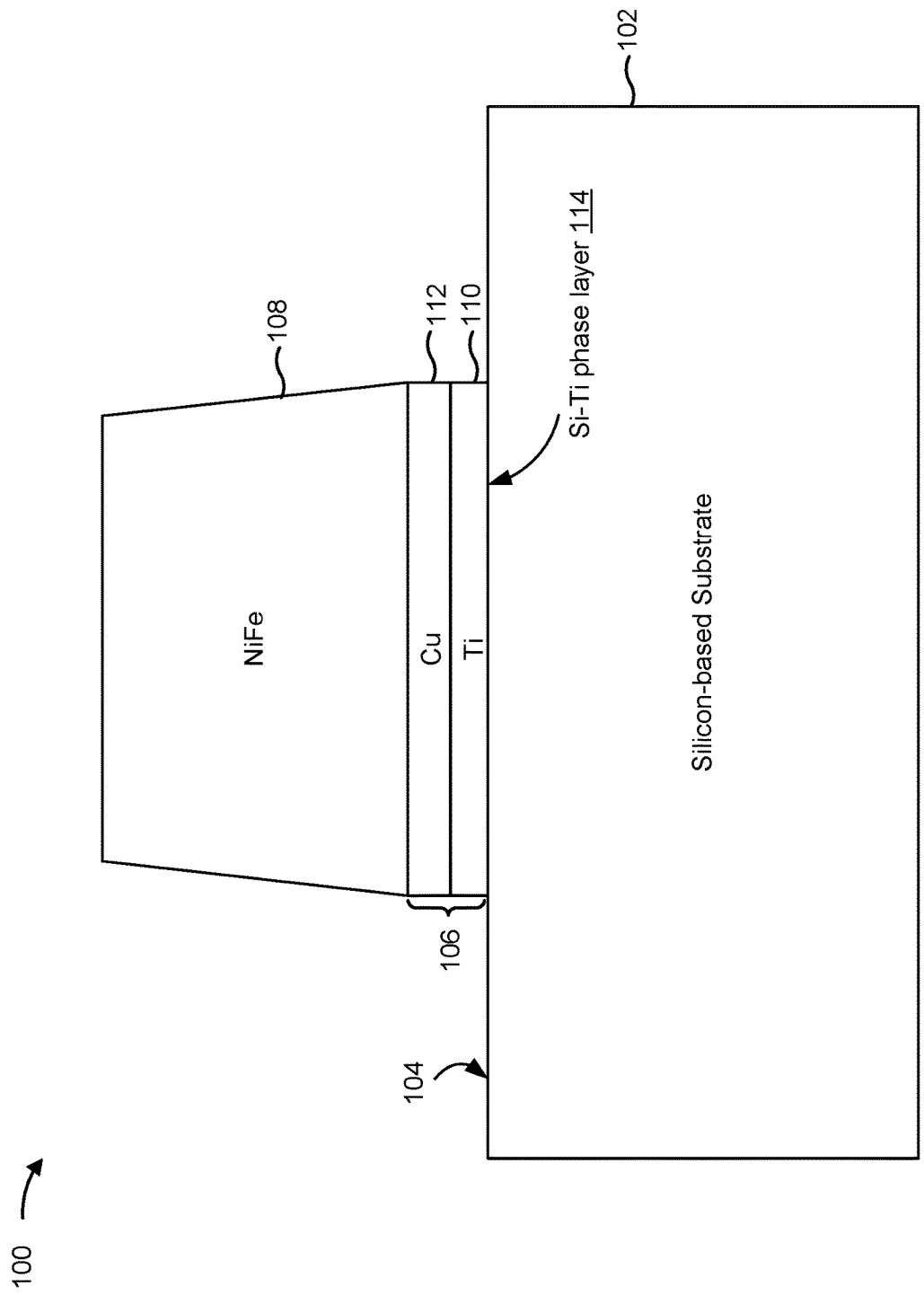
FIG. 1 is a cross-section of a layered structure according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view, rather than in detail, in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually interchangeable.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath,"

"lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling (e.g., any connection or coupling without additional intervening elements) may also be implemented by an indirect connection or coupling (e.g., a connection or coupling with one or more additional intervening elements, or vice versa) as long as the general purpose of the connection or coupling (e.g., to transmit a certain kind of signal or to transmit a certain kind of information) is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, a signal with an approximate signal value may practically have a signal value within 5% of the approximate signal value.

In the present disclosure, expressions including ordinal numbers, such as "first", "second", and/or the like, may modify various elements. However, such elements are not limited by such expressions. For example, such expressions do not limit the sequence and/or importance of the elements. Instead, such expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A seed layer is typically used for a pattern plating processes, such as an electro-galvanic deposition (e.g., electroplating) of a metal layer. Seed layers can help to distribute current homogeneously over a wafer to realize uniform growth and correct lattice structure of galvanically-deposited metal layers. A seed layer should fulfill three requirements: provide sufficient adhesion between the galvanically-deposited metal layer and the wafer, enable homogeneous growth of the galvanically-deposited metal layer over the wafer, and define a lattice structure of the galvanically-deposited metal layer that is stable. In order to enable homogeneous growth of the galvanically-deposited metal layer over the wafer, the seed layer should have suitable to conductivity to enable homogeneous distribution of current in the seed layer during an electro-galvanic deposition process. Homogeneous growth and a stable lattice structure of the galvanically-deposited metal layer may contribute to a quality of adhesion between the galvanically-deposited metal layer and the wafer. Better homogeneous growth and higher lattice structure stability may improve the adhesion.

A soft-magnetic alloy, such as nickel-iron (NiFe), may have many uses in magnetic field applications. For example, nickel-iron may be used to provide magnetic field shielding, magnetic field focusing, and/or magnetic field redirection. Current solutions for electroplating NiFe onto a silicon (Si)-based substrate may not achieve all seed-layer requirements described above or can be improved. For example, nickel-iron has a high-tensile stress, which increases with an increase in thickness of a nickel-iron layer. The high-tensile stress may cause the nickel-iron layer to separate from the seed layer if sufficient adhesion between the nickel-iron layer and the seed layer is not achieved. In other words, a lifetime of the structure may be limited to an amount of time that the nickel-iron layer is able to remain adhered to the seed layer. Thus, a thickness of the nickel-iron layer may be limited to an amount of tensile stress that an adhesion between the nickel-iron layer and the seed layer can tolerate. In some cases, the thickness of the nickel-iron layer must remain smaller than 5 micrometers ($\mu m$) such that the tensile stress induced by the nickel-iron layer does not cause the adhesion between the nickel-iron layer and the seed layer to fail. Such a small thickness of the nickel-iron layer may limit practical applications that may benefit from nickel-iron layers bonded to a silicon-based substrate. Seed layers of NiCr, NiFe, TiWCu, Ti, and Ta are all inadequate in this regard.

Accordingly, some implementations disclosed herein are directed to a layered structure that includes a silicon-based substrate comprising a substrate surface; a titanium-copper seed layer arranged on the substrate surface; and a nickel-iron plating layer (e.g., an electroplated NiFe layer) arranged directly on the titanium-copper seed layer. The titanium-copper (TiCu) seed layer comprises a titanium layer and a copper layer, where the titanium layer is arranged on the substrate surface of the silicon-based substrate such that covalent bonds are formed between the titanium layer and silicon of the silicon-based substrate. The copper layer is arranged directly on the titanium layer, such that the titanium layer is arranged between the substrate surface of the silicon-based substrate and the copper layer. The nickel-iron plating layer is arranged directly on the copper layer of the titanium-copper seed layer such that the titanium-copper seed layer is arranged between the silicon-based substrate and the nickel-iron plating layer. The nickel-iron plating layer may be formed on the TiCu seed layer via an electro-galvanic deposition process.

The copper layer has a high conductivity. As a result, a homogeneous distribution of current in the TiCu seed layer can be achieved during the electro-galvanic deposition process. As a result, a homogeneous galvanic deposition of the nickel-iron plating layer onto the TiCu seed layer (e.g., onto the copper layer) can be achieved. As a result, an adhesion strength between the nickel-iron plating layer and the copper layer is very high.

In addition, titanium forms a very good adhesion with silicon. For example, the titanium establishes a strong connection with silicon due to a formation of a titanium-silicon phase layer (e.g., a titanium-silicide layer or a titanium-disilicide layer) at an interface at which the titanium is in contact with the silicon. In other words, the covalent bonds formed between the titanium layer and silicon of the silicon-based substrate provide high adhesion strength between the titanium layer and the silicon-based substrate. Thus, lattice structures of the titanium-silicon phase layer and the nickel-iron plating layer are very stable. For example, an adhesion test (e.g., an adhesion test with a sebastian five pull tester) on different seed layer materials confirmed the good and stable connection between titanium and silicon. The force which was needed to destroy the connection between a bonded stamp on the seed layer surface and the pad, was significantly higher with a TiCu seed layer than with TiWCu, NiCr or NiFe seed layers. In addition, an experiment proved that, for all seed layer samples containing titanium, only glue was detected on a surface of the bonded stamp after the experiment, whereas for other seed layer samples (e.g., with a NiFe seed layer or a NiCr seed layer) metallic elements of the respective seed layers were detected on the surface of the bonded stamp. In other words, titanium formed a much stronger connection with silicon compared to a connection formed by another material with silicon.

As a result of the strong adhesion between all adjacent layers of the layered structure, it is possible to form the nickel-iron plating layer with a thickness that is equal to or greater than 5 µm (e.g., between 5-20 µm) without compromising an integrity of the adhesion between one or more of the layers of the layered structure. Thus, longer product lifetimes may be achieved and thicker NiFe layers with thicknesses between 5-20 µm formed on a silicon-based substrate can be used in additional applications that would otherwise not be practical with NiFe layers with thicknesses smaller than 5 µm on silicon-based substrates.

FIG. 1 is a cross-section of a layered structure 100 according to one or more implementations. The layered structure 100 includes a silicon-based substrate 102 comprising a substrate surface 104, a titanium-copper (TiCu) seed layer 106 arranged on the substrate surface 104, and a nickel-iron plating layer 108 (e.g., an electroplated NiFe layer) arranged directly on the titanium-copper seed layer 106. The silicon-based substrate 102 may be a silicon layer or a silicon oxide (SiOx) layer.

The titanium-copper seed layer 106 comprises a titanium (Ti) layer 110 and a copper (Cu) layer 112. The titanium layer 110 may be made solely of titanium. The copper layer 112 may be made solely of copper. The titanium layer 110 may be arranged on the substrate surface 104 of the silicon-based substrate such that covalent bonds are formed between the titanium layer 110 and silicon of the silicon-based substrate 102. For example, titanium atoms of the titanium layer 110 and silicon atoms of the silicon-based substrate 102 may combine to form a titanium-silicon phase layer 114, such as titanium-silicide or titanium-disilicide, at an interface of the silicon-based substrate 102 and the titanium layer 110. The copper layer 112 may be arranged directly on the titanium layer 110, such that the titanium layer 110 is arranged between the substrate surface 104 of the silicon-based substrate 102 and the copper layer 112.

The nickel-iron plating layer 108 is arranged directly on the copper layer 112 of the titanium-copper seed layer 106 such that the titanium-copper seed layer 106 is arranged between the silicon-based substrate 102 and the nickel-iron plating layer 108. The nickel-iron plating layer 108 may be formed on the titanium-copper seed layer 106 via an electro-galvanic deposition process.

A thickness of the nickel-iron plating layer 108 may be 5-20 µm. A thickness of the titanium layer 110 may be less than 350 nanometers (nm) and a thickness of the copper layer 112 may be 100-350 nm. Thus, a thick nickel-iron plating layer 108 may be formed on the titanium-copper seed layer 106 that does not compromise an integrity of the adhesion between one or more of the layers of the layered structure 100.

Furthermore, the copper layer 112 may define a lattice structure of the nickel-iron plating layer. For example, due to the copper layer's high conductivity, a homogeneous distribution of current in the titanium-copper seed layer 106 can be achieved during the electro-galvanic deposition process. As a result, a homogeneous galvanic deposition of the nickel-iron plating layer 108 onto the titanium-copper seed layer 106 (e.g., onto the copper layer 112) can be achieved, resulting in the nickel-iron plating layer 108 having a homogenous lattice structure.

As a result of the strong adhesion between all adjacent layers of the layered structure 100, it is possible to form the nickel-iron plating layer 108 with a thickness that is equal to or greater than 5 µm (e.g., between 5-20 µm) without compromising the integrity of the adhesion between one or more of the layers of the layered structure 110. Thus, longer product lifetimes may be achieved and thicker NiFe layers with thicknesses between 5-20 µm formed on a silicon-based substrate 102 can be used in additional applications that would otherwise not be practical with NiFe layers with thicknesses smaller than 5 µm on silicon-based substrates. For example, the layered structure 100 may be integrated in a semiconductor device (e.g., a semiconductor chip) and/or a magnetic field sensor system. In some implementations, the silicon-based substrate 102 may be a medium in which an integrated circuit is formed, including a plurality of circuit components (e.g., transistors, diodes, and/or other electronic components). In some implementations, the nickel-iron plating layer 108 may have a plating pattern configured to receive an initial magnetic field and focus the initial magnetic field in order to output a focused magnetic field having an increased field strength relative to the initial magnetic field. In some implementations, the nickel-iron plating layer 108 may have a plating pattern configured to attract a magnetic field in order to redirect at least a portion of the magnetic field away from an area such that a field strength of the magnetic field in the area is reduced. In some implementations, the nickel-iron plating layer 108 may have a plating pattern configured to receive a magnetic field and redirect at least a portion of the magnetic field from an incoming direction into a redirected direction such that a field strength of the magnetic field in the redirected direction is increased.

As indicated above, FIG. 1 is provided as an example. Other examples may differ from what is described with regard to FIG. 1.

FIGS. 2A-2D illustrate an example process directed to manufacturing an electroplated structure according to one or more implementations. The electroplated structure may correspond to the layered structure 100 described in connection with FIG. 1.

Figure 2A:
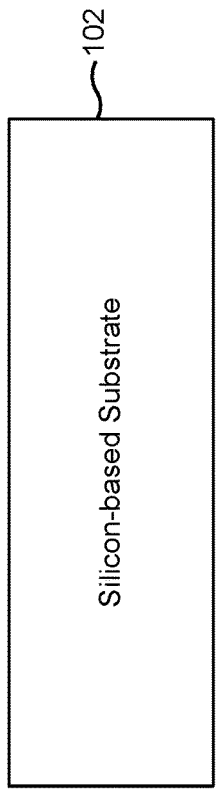

FIG. 2A illustrates a process step 200A, including providing the silicon-based substrate 102 comprising the substrate surface 104.

Figure 2B:
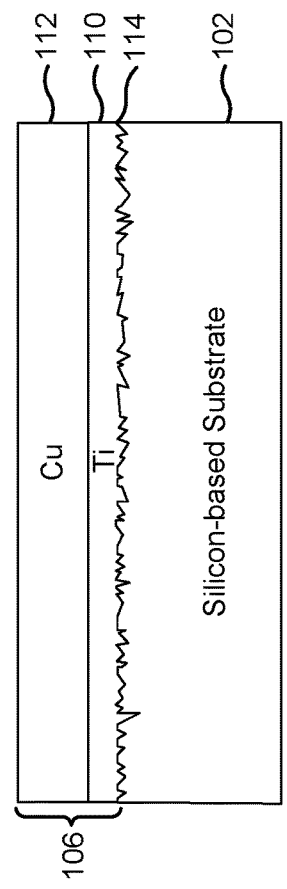

FIG. 2B illustrates a further process step 200B, including forming the titanium-copper seed layer 106 directly on the substrate surface 104 of the silicon-based substrate 102. Forming the titanium-copper seed layer 106 directly on the substrate surface 104 of the silicon-based substrate 102 may include forming the titanium layer 110 directly on the substrate surface 104 such that covalent bonds are formed between the titanium layer 110 and silicon of the silicon-based substrate 102. As a result, titanium atoms of the titanium layer 110 and silicon atoms of the silicon-based substrate 102 may combine to form a titanium-silicon phase layer 114 at an interface of the silicon-based substrate 102 and the titanium layer 110. Forming the titanium-copper seed layer 106 directly on the substrate surface 104 of the silicon-based substrate 102 may further include forming the copper layer 112 directly on the titanium layer 110 such that the titanium layer 110 is arranged between the silicon-based substrate 102 and the copper layer 112.

The titanium layer 110 and the copper layer 112 may be formed by respective physical vapor deposition (PVD) processes. Each respective PVD process may include a descum and surface preclean prior to depositing a respective seed layer coating. Titanium and copper may be sputtered in separated chambers without a vacuum break or in one chamber with different targets.

FIG. 2C illustrates further process steps 200C, including forming a patterned resist layer 202 on the copper layer 112 and, subsequent to forming the patterned resist layer 202 (e.g., a negative resist layer), forming, by electro-galvanic deposition, the nickel-iron plating layer 108 directly on the copper layer 112 such that the copper layer 112 is arranged between the titanium layer 110 and the nickel-iron plating layer 108. The nickel-iron plating layer 108 may be electro-galvanically deposited by applying current to the copper layer 112 while in an aqueous electrolyte solution.

The patterned resist layer 202 may have a pattern that covers a portion of the copper layer 112 and exposes a remaining portion of the copper layer 112. The patterning of the patterned resist layer 202 may be performed using an optical lithography process. The patterning of the patterned resist layer 202 results in some areas of the copper layer 112 being exposed for NiFe plating. Thus, the nickel-iron plating layer 108 may be formed, by the electro-galvanic deposition, onto the remaining (exposed) portion of the copper layer 112. As a result, the nickel-iron plating layer 108 may have a pattern corresponding to the exposed areas of the copper layer 112 that are free of the patterned resist layer 202. The use of other types of resists (e.g., positive resists) are also possible.

FIG. 2D illustrates further process steps 200D, including removing the patterned resist layer 202 after forming the nickel-iron plating layer 108, and, subsequent to removing the patterned resist layer 202, removing the copper layer 112 and the titanium layer 110 from areas that are not between the nickel-iron plating layer 108 and the silicon-based substrate 102. Thus, only portions of the copper layer 112 and the titanium layer 110 arranged directly between (e.g., vertically between) the nickel-iron plating layer 108 and the silicon-based substrate 102 may remain.

The patterned resist layer 202 may be removed by resist removal processes, such as with an oxygen plasma and/or wet chemical resist strip.

The copper layer 112 and the titanium layer 110 may be removed with wet chemistry (e.g., phosphoric acid) or an ion etching process, such as with reactive ion etching with inert gas in a chloric or fluoric atmosphere or with ion beam etching with inert gas only.

As indicated above, FIGS. 2A-2D are provided as examples. Other examples may differ from what is described with regard to FIGS. 2A-2D.

FIG. 3A illustrates a magnetic sensor system 300A according to one or more implementations. The magnetic sensor system 300A includes a substrate 302 and one or more magnetic sensors 304 formed on the substrate 302. Each magnetic sensor 304 may be a sensor cell that is configured to generate a respective sensor signal in response to a magnetic field incident at the magnetic sensor 304. The magnetic sensor system 300A may also include the layered structure 100 as described in connection with FIG. 1. Here, only the nickel-iron plating layer 108 (e.g., NiFe) of the layered structure 100 is shown. The nickel-iron plating layer 108 may have a plating pattern configured to manipulate the magnetic field incident at the magnetic sensor. For example, the nickel-iron plating layer 108 may have a plating pattern configured to focus the magnetic field onto the one or more magnetic sensors 304. In other words, the nickel-iron plating layer 108 may receive the magnetic field and provide a focused magnetic field to the one or more magnetic sensors 304 in order to increase a magnetic field strength (e.g., magnetic flux density) at the one or more magnetic sensors 304.

Thus, the one or more magnetic sensors 304 may be capable of sensing weaker magnetic fields that may not otherwise be possible without placing the one or more magnetic sensors 304 extremely close to a magnetic field source of the magnetic field. For example, the layered structure 100 may be used in low current applications that inherently produce weak magnetic fields. As a result, the one or more magnetic sensors 304 may be placed further from the magnetic field source, which may relax design constraints of a magnetic sensor system. Additionally, or alternatively, the focused magnetic field may be better distinguished from noise and interference, leading to more accurate sensing of the focused magnetic field.

As indicated above, FIG. 3A is provided as an example. Other examples may differ from what is described with regard to FIG. 3A.

FIG. 3B illustrates a magnetic sensor system 300B according to one or more implementations. The magnetic sensor system 300B includes a substrate 302 and one or more magnetic sensors 304 formed on the substrate 302. Each magnetic sensor 304 may be a sensor cell that is configured to generate a respective sensor signal in response to a magnetic field incident at the magnetic sensor 304. The magnetic sensor system 300B may also include the layered structure 100 as described in connection with FIG. 1. Here, only the nickel-iron plating layer 108 (e.g., NiFe) of the layered structure 100 is shown. The nickel-iron plating layer 108 may have a plating pattern configured to manipulate the magnetic field incident at the magnetic sensor. For example, the nickel-iron plating layer 108 may have a plating pattern configured to redirect at least a portion of the magnetic field away from the one or more magnetic sensors 304. For example, the nickel-iron plating layer 108 may attract a portion of the magnetic field away from the one or more magnetic sensors 304 such that only a portion (e.g., a reduced portion) of the magnetic field passes through the one or more magnetic sensors 304. Thus, the nickel-iron plating layer 108 may be used in applications that could benefit from reducing strong magnetic fields to be within a sensing range of the one or more magnetic sensors 304, for example, to avoid saturation.

As indicated above, FIG. 3B is provided as an example. Other examples may differ from what is described with regard to FIG. 3B.

Figure 3C:
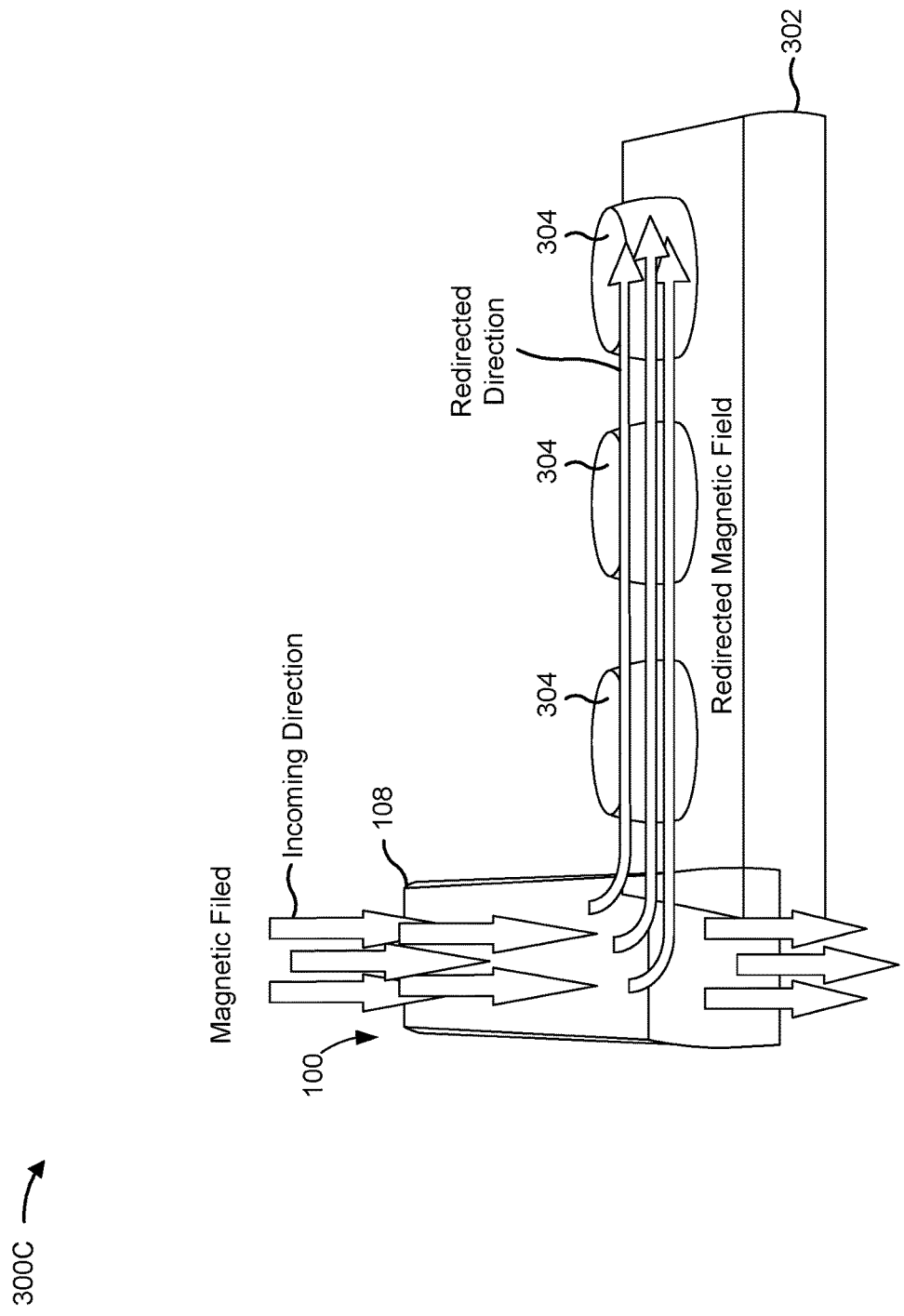
FIG. 3C illustrates a magnetic sensor system according to one or more implementations.

FIG. 3C illustrates a magnetic sensor system 300C according to one or more implementations. The magnetic sensor system 300C includes a substrate 302 and one or more magnetic sensors 304 formed on the substrate 302. Each magnetic sensor 304 may be a sensor cell that is configured to generate a respective sensor signal in response to a magnetic field incident at the magnetic sensor 304. The magnetic sensor system 300C may also include the layered structure 100 as described in connection with FIG. 1. Here, only the nickel-iron plating layer 108 (e.g., NiFe) of the layered structure 100 is shown. The nickel-iron plating layer 108 may have a plating pattern configured to manipulate the magnetic field incident at the magnetic sensor. For example, the nickel-iron plating layer 108 may have a plating pattern configured to redirect at least a portion of the magnetic field from an incoming direction into a redirected direction such that a field strength of the magnetic field in the redirected direction is increased. As a result, the magnetic field may be redirected to align with a sensitive axis of the one or more magnetic sensors 304, which may enable the one or more magnetic sensors 304 to sense magnetic fields that are not initially aligned with the sensitive axis.

As indicated above, FIG. 3C is provided as an example. Other examples may differ from what is described with regard to FIG. 3C.

The following provides an overview of some Aspects of the present disclosure:

Aspect 1: A layered structure, comprising: a silicon-based substrate comprising a substrate surface; a titanium-copper seed layer arranged on the substrate surface, wherein the titanium-copper seed layer comprises a titanium layer and a copper layer, wherein the titanium layer is arranged on the substrate surface such that covalent bonds are formed between the titanium layer and silicon of the silicon-based substrate, and wherein the copper layer is arranged directly on the titanium layer, such that the titanium layer is arranged between the substrate surface and the copper layer; and a nickel-iron plating layer arranged directly on the copper layer of the titanium-copper seed layer such that the titanium-copper seed layer is arranged between the silicon-based substrate and the nickel-iron plating layer.

Aspect 2: The layered structure of Aspect 1, wherein titanium atoms of the titanium layer and silicon atoms of the silicon-based substrate combine to form a titanium-silicon phase layer at an interface of the silicon-based substrate and the titanium layer.

Aspect 3: The layered structure of any of Aspects 1-2, wherein the silicon-based substrate is a silicon substrate or a silicon oxide substrate.

Aspect 4: The layered structure of any of Aspects 1-3, wherein a thickness of the nickel-iron plating layer is 5-20 micrometers (μm).

Aspect 5: The layered structure of Aspect 4, wherein a thickness of the titanium layer is less than 350 nanometers (nm) and a thickness of the copper layer is 100-350 nm.

Aspect 6: The layered structure of any of Aspects 1-5, wherein the copper layer defines a lattice structure of the nickel-iron plating layer.

Aspect 7: The layered structure of any of Aspects 1-6, wherein the nickel-iron plating layer has a plating pattern configured to receive an initial magnetic field and focus the initial magnetic field in order to output a focused magnetic field having an increased field strength relative to the initial magnetic field.

Aspect 8: The layered structure of any of Aspects 1-7, wherein the nickel-iron plating layer has a plating pattern configured to attract a magnetic field in order to redirect at least a portion of the magnetic field away from an area such that a field strength of the magnetic field in the area is reduced.

Aspect 9: The layered structure of any of Aspects 1-8, wherein the nickel-iron plating layer has a plating pattern configured to receive a magnetic field and redirect at least a portion of the magnetic field from an incoming direction into a redirected direction such that a field strength of the magnetic field in the redirected direction is increased.

Aspect 10: A magnetic sensor system, comprising: a magnetic sensor configured to generate a sensor signal in response to a magnetic field incident at the magnetic sensor; and a layered structure, comprising: a silicon-based substrate comprising a substrate surface; a titanium-copper seed layer arranged on the substrate surface, wherein the titanium-copper seed layer comprises a titanium layer and a copper layer, wherein the titanium layer is arranged on the substrate surface such that covalent bonds are formed between the titanium layer and silicon of the silicon-based substrate, and wherein the copper layer is arranged directly on the titanium layer, such that the titanium layer is arranged between the substrate surface and the copper layer; and a nickel-iron plating layer arranged directly on the copper layer of the titanium-copper seed layer such that the titanium-copper seed layer is arranged between the silicon-based substrate and the nickel-iron plating layer, wherein the nickel-iron plating layer has a plating pattern configured to manipulate the magnetic field incident at the magnetic sensor.

Aspect 11: The magnetic sensor system of Aspect 10, wherein the nickel-iron plating layer has a plating pattern configured to focus the magnetic field onto the magnetic sensor.

Aspect 12: The magnetic sensor system of any of Aspects 10-11, wherein the nickel-iron plating layer has a plating pattern configured to redirect at least a portion of the magnetic field away from the magnetic sensor.

Aspect 13: The magnetic sensor system of any of Aspects 10-12, wherein the nickel-iron plating layer has a plating pattern configured to redirect at least a portion of the magnetic field from an incoming direction into a redirected direction such that a field strength of the magnetic field in the redirected direction is increased.

Aspect 14: A method of manufacturing an electroplated structure, the method comprising: providing a silicon-based substrate comprising a substrate surface; forming a titanium layer directly on the substrate surface such that covalent bonds are formed between the titanium layer and silicon of the silicon-based substrate; forming a copper layer directly on the titanium layer such that the titanium layer is arranged between the silicon-based substrate and the copper layer; and forming, by electro-galvanic deposition, a nickel-iron plating layer directly on the copper layer such that the copper layer is arranged between the titanium layer and the nickel-iron plating layer.

Aspect 15: The method of Aspect 14, further comprising: prior to forming the nickel-iron plating layer, forming a patterned resist layer on the copper layer, wherein the patterned resist layer has a pattern that covers a portion of the copper layer and exposes a remaining portion of the copper layer, and wherein the nickel-iron plating layer is formed, by the electro-galvanic deposition, onto the remaining portion of the copper layer.

Aspect 16: The method of Aspect 15, further comprising: subsequent to forming the nickel-iron plating layer, removing the patterned resist layer; and subsequent to removing the patterned resist layer, removing the copper layer and the titanium layer from areas that are not between the nickel-iron plating layer and the silicon-based substrate.

Aspect 17: The method of any of Aspects 14-16, wherein the titanium layer and the copper layer are formed by physical vapor deposition (PVD).

Aspect 18: The method of any of Aspects 14-17, wherein titanium atoms of the titanium layer and silicon atoms of the silicon-based substrate combine to form a titanium-silicon phase layer at an interface of the silicon-based substrate and the titanium layer.

Aspect 19: The method of any of Aspects 14-18, wherein the silicon-based substrate is a silicon substrate or a silicon oxide substrate.

Aspect 20: The method of any of Aspects 14-19, wherein a thickness of the nickel-iron plating layer is 5-20 micrometers (μm), and wherein a thickness of the titanium layer is less than 350 nanometers (nm) and a thickness of the copper layer is 100-350 nm.

Aspect 21: The method of any of Aspects 14-20, wherein the copper layer defines a lattice structure of the nickel-iron plating layer.

Aspect 22: A system configured to perform one or more operations recited in one or more of Aspects 14-21.

Aspect 23: A semiconductor device, comprising: a layered structure integrated in the semiconductor device, the layered structure comprising: a silicon-based substrate comprising a substrate surface; a titanium-copper seed layer arranged on the substrate surface, wherein the titanium-copper seed layer comprises a titanium layer and a copper layer, wherein the titanium layer is arranged on the substrate surface such that covalent bonds are formed between the titanium layer and silicon of the silicon-based substrate, and wherein the copper layer is arranged directly on the titanium layer, such that the titanium layer is arranged between the substrate surface and the copper layer; and a nickel-iron plating layer arranged directly on the copper layer of the titanium-copper seed layer such that the titanium-copper seed layer is arranged between the silicon-based substrate and the nickel-iron plating layer.

The foregoing disclosure provides illustration and description, but is not intended to be exhaustive or to limit the implementations to the precise form disclosed. Modifications and variations may be made in light of the above disclosure or may be acquired from practice of the implementations.

Some implementations may be described herein in connection with thresholds. As used herein, "satisfying" a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

As used herein, the term "component" is intended to be broadly construed as hardware, firmware, or a combination of hardware and software. Systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein, refers to any of the foregoing structures or any other structure suitable for implementation of the techniques described herein. Software may be stored on a non-transitory computer-readable medium such that the non-transitory computer readable medium includes program code or a program algorithm stored thereon that, when executed, causes the processor, via a computer program, to perform the steps of a method.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal, further information. "Signal conditioning," as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a and b, a and c, b and c, and a, b, and c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A layered structure, comprising:
    a silicon-based substrate comprising a substrate surface;
    a titanium-copper seed layer arranged on the substrate surface,
        wherein the titanium-copper seed layer comprises a titanium layer and a copper layer,
        wherein the titanium layer is arranged on the substrate surface such that covalent bonds are formed between the titanium layer and silicon of the silicon-based substrate, and
        wherein the copper layer is arranged directly on the titanium layer, such that the titanium layer is arranged between the substrate surface and the copper layer; and
    a nickel-iron plating layer arranged directly on the copper layer of the titanium-copper seed layer such that the titanium-copper seed layer is arranged between the silicon-based substrate and the nickel-iron plating layer.

2. The layered structure of claim 1, wherein titanium atoms of the titanium layer and silicon atoms of the silicon-based substrate combine to form a titanium-silicon phase layer at an interface of the silicon-based substrate and the titanium layer.

3. The layered structure of claim 1, wherein the silicon-based substrate is a silicon substrate or a silicon oxide substrate.

4. The layered structure of claim 1, wherein a thickness of the nickel-iron plating layer is 5-20 micrometers (μm).

5. The layered structure of claim 4, wherein a thickness of the titanium layer is less than 350 nanometers (nm) and a thickness of the copper layer is 100-350 nm.

6. The layered structure of claim 1, wherein the copper layer defines a lattice structure of the nickel-iron plating layer.

7. The layered structure of claim 1, wherein the nickel-iron plating layer has a plating pattern configured to receive an initial magnetic field and focus the initial magnetic field in order to output a focused magnetic field having an increased field strength relative to the initial magnetic field.

8. The layered structure of claim 1, wherein the nickel-iron plating layer has a plating pattern configured to attract a magnetic field in order to redirect at least a portion of the magnetic field away from an area such that a field strength of the magnetic field in the area is reduced.

9. The layered structure of claim 1, wherein the nickel-iron plating layer has a plating pattern configured to receive a magnetic field and redirect at least a portion of the magnetic field from an incoming direction into a redirected direction such that a field strength of the magnetic field in the redirected direction is increased.

10. A magnetic sensor system, comprising:
    a magnetic sensor configured to generate a sensor signal in response to a magnetic field incident at the magnetic sensor; and
    a layered structure, comprising:
        a silicon-based substrate comprising a substrate surface;
        a titanium-copper seed layer arranged on the substrate surface,
            wherein the titanium-copper seed layer comprises a titanium layer and a copper layer,
            wherein the titanium layer is arranged on the substrate surface such that covalent bonds are formed between the titanium layer and silicon of the silicon-based substrate, and
            wherein the copper layer is arranged directly on the titanium layer, such that the titanium layer is arranged between the substrate surface and the copper layer; and
        a nickel-iron plating layer arranged directly on the copper layer of the titanium-copper seed layer such that the titanium-copper seed layer is arranged between the silicon-based substrate and the nickel-iron plating layer,
    wherein the nickel-iron plating layer has a plating pattern configured to manipulate the magnetic field incident at the magnetic sensor.

11. The magnetic sensor system of claim 10, wherein the nickel-iron plating layer has a plating pattern configured to focus the magnetic field onto the magnetic sensor.

12. The magnetic sensor system of claim 10, wherein the nickel-iron plating layer has a plating pattern configured to redirect at least a portion of the magnetic field away from the magnetic sensor.

13. The magnetic sensor system of claim 10, wherein the nickel-iron plating layer has a plating pattern configured to redirect at least a portion of the magnetic field from an incoming direction into a redirected direction such that a field strength of the magnetic field in the redirected direction is increased.

14. A method of manufacturing an electroplated structure, the method comprising:
    providing a silicon-based substrate comprising a substrate surface;
    forming a titanium layer directly on the substrate surface such that covalent bonds are formed between the titanium layer and silicon of the silicon-based substrate;
    forming a copper layer directly on the titanium layer such that the titanium layer is arranged between the silicon-based substrate and the copper layer; and forming, by electro-galvanic deposition, a nickel-iron plating layer directly on the copper layer such that the copper layer is arranged between the titanium layer and the nickel-iron plating layer.

15. The method of claim 14, further comprising:

prior to forming the nickel-iron plating layer, forming a patterned resist layer on the copper layer, wherein the patterned resist layer has a pattern that covers a portion of the copper layer and exposes a remaining portion of the copper layer, and wherein the nickel-iron plating layer is formed, by the electro-galvanic deposition, onto the remaining portion of the copper layer.

16. The method of claim 15, further comprising:

subsequent to forming the nickel-iron plating layer, removing the patterned resist layer; and subsequent to removing the patterned resist layer, removing the copper layer and the titanium layer from areas that are not between the nickel-iron plating layer and the silicon-based substrate.

17. The method of claim 14, wherein the titanium layer and the copper layer are formed by physical vapor deposition (PVD).

18. The method of claim 14, wherein titanium atoms of the titanium layer and silicon atoms of the silicon-based substrate combine to form a titanium-silicon phase layer at an interface of the silicon-based substrate and the titanium layer.

19. The method of claim 14, wherein the silicon-based substrate is a silicon substrate or a silicon oxide substrate.

20. The method of claim 14, wherein a thickness of the nickel-iron plating layer is 5-20 micrometers (μm), and wherein a thickness of the titanium layer is less than 350 nanometers (nm) and a thickness of the copper layer is 100-350 nm.

21. The method of claim 14, wherein the copper layer defines a lattice structure of the nickel-iron plating layer.

22. A semiconductor device, comprising:

a layered structure integrated in the semiconductor device, the layered structure comprising:

a silicon-based substrate comprising a substrate surface;

a titanium-copper seed layer arranged on the substrate surface, wherein the titanium-copper seed layer comprises a titanium layer and a copper layer, wherein the titanium layer is arranged on the substrate surface such that covalent bonds are formed between the titanium layer and silicon of the silicon-based substrate, and wherein the copper layer is arranged directly on the titanium layer, such that the titanium layer is arranged between the substrate surface and the copper layer; and a nickel-iron plating layer arranged directly on the copper layer of the titanium-copper seed layer such that the titanium-copper seed layer is arranged between the silicon-based substrate and the nickel-iron plating layer.

* * * * *